(12) United States Patent
Nishiyama (10) Patent No.: US 7,911,909 B2
(45) Date of Patent: Mar. 22, 2011

(54) JITTER COUNTER AND OPTICAL DISC APPARATUS USING SAME

(75) Inventor: Takahiro Nishiyama, Kyoto (JP)

(73) Assignee: Rohm Co., Ltd., Kyoto-shi, Kyoto (*) Notice: Subject to any disclaimer, the term of this patent is extended or adjusted under 35 U.S.C. 154(b) by 337 days.

(21) Appl. No.: 12/250,590

(22) Filed: Oct. 14, 2008

(65) Prior Publication Data

US 2009/0097373 A1    Apr. 16, 2009

(30) Foreign Application Priority Data

Oct. 15, 2007  (JP) ................................. 2007-267319

(51) Int. Cl.
*G11B 20/10* (2006.01)
*H03D 3/24* (2006.01)

(52) U.S. Cl. ................. 369/53.34; 369/59.2; 369/47.28; 369/44.34; 375/376

(58) Field of Classification Search ............... 369/53.34, 369/47.28, 44.34, 59.2, 59.16, 59.19, 124.01, 369/124.14, 47.48; 375/371, 373, 375, 376; 360/51; 372/156

See application file for complete search history.

(56) References Cited

U.S. PATENT DOCUMENTS

| 5,117,412 | A  | * | 5/1992  | Ito et al. ................... | 369/124.14 |
| 5,293,275 | A  | * | 3/1994  | Kawasaki .................. | 360/51 |
| 5,663,942 | A  | * | 9/1997  | Ishibashi et al. ........... | 369/53.34 |
| 6,100,724 | A  | * | 8/2000  | Yoshimura et al. ........ | 369/53.34 |
| 6,611,481 | B1 | * | 8/2003  | Koishi et al. ............... | 369/47.53 |
| 6,791,926 | B1 | * | 9/2004  | Furumiya et al. .......... | 369/53.13 |
| 6,807,134 | B2 | * | 10/2004 | Nakajima et al. .......... | 369/47.35 |
| 7,406,145 | B2 | * | 7/2008  | Mori ............................ | 375/376 |
| 2008/0019234 | A1 | * | 1/2008  | Shiono ....................... | 369/44.25 |

FOREIGN PATENT DOCUMENTS

| JP | 2001-266359 | 9/2001 |
| JP | 2005-018843 | 1/2005 |
| JP | 2005-293812 | 10/2005 |
| JP | 2006-127620 | 5/2006 |

* cited by examiner

*Primary Examiner* — Thang V Tran
(74) *Attorney, Agent, or Firm* — Fish & Richardson P.C.

(57) ABSTRACT

A jitter counter according to the present invention is connected to a PLL circuit for generating a clock signal, which is necessary for signal processing, from a binary signal, and counts jitters of the binary signal. The jitter counter comprises: a determination signal generation circuit which uses an output signal from a VCO constituting the PLL circuit and the like to generate a determination signal that has a given pulse width having the phase center at the position of a pulse edge of the clock signal; a phase determination circuit which at every time when logic inversion of the binary signal occurs, determines whether or not the inversion position is present in a determination section given by the pulse width of the determination signal based on an output signal from a phase comparator constituting the PLL circuit and on the determination signal; a phase counter which counts the number of times that inversion positions of the binary signal are not present in the determination section (or times that inversion positions of the binary signal are present in the determination section) based on an output signal from the phase determination circuit, wherein a count value of the phase counter is output as a jitter count value.

7 Claims, 7 Drawing Sheets

JITTER COUNTER AND OPTICAL DISC APPARATUS USING SAME

This application is based on Japanese Patent Application No. 2007-267319 filed on Oct. 15, 2007, the contents of which are hereby incorporated by reference.

BACKGROUND OF THE INVENTION

1. Field of the Invention

The present invention relates to a jitter counter, and to an optical disc apparatus using same.

2. Description of Related Art

Conventionally, in an optical disc apparatus that performs data recording/reproduction to and from an optical disc, a jitter counter that counts jitters of a binary-coded reproduction high-frequency signal (hereinafter, called a binary RF [Radio Frequency] signal) has been incorporated.

As documents that disclose examples of the prior art relating to a jitter counter, there are JP-A-2001-266359, JP-A-2005-18843, JP-A-2005-293812, and JP-A-2006-127620 (hereinafter, called as patent documents 1-4).

Indeed, an optical disc apparatus that incorporates a jitter counter can optimally adjust an offset amount of focus servo and offset servo, waveform equalization characteristics of an RF amplifier, and various characteristics of an optical pickup based on a jitter count value of a binary RF signal.

However, in the patent document 1, a jitter counter disclosed as an example of the prior art is so structured as to convert an output signal from a phase comparator into an absolute value, then, apply an A/D [analog/digital] conversion to the absolute value through an integrator, and carry out a jitter count. Therefore, a high-accurate analog integrator and an A/D converter are required.

Besides, the inventive apparatus described in the patent document 1 is so structured that it takes advantage of a characteristic that jitter shows a normal distribution, and counts the number of inversion positions of a binary signal using a clock that is slightly shifted in phase from a channel clock, and carries out the jitter count. Therefore, not only a PLL [Phase Locked Loop] circuit for signal reproduction but also a PLL circuit dedicated to the jitter count are additionally required.

The inventive apparatus described in the patent document 2 is SO structured that it applies sampling to a binary signal using an N-phase clock synchronized with a channel clock, and obtains information that has an N-time resolution in a time direction, and carries out the jitter count. Therefore, a VCO [Voltage Controlled Oscillator] dedicated to the jitter count is required, and a high-accurate N-phase clock layout is also required.

The inventive apparatus described in the patent document 3 is so structured that it counts a high-level width and a low-level width of a binary signal using a clock much faster than a channel clock, and carries out the jitter count. Therefore, a clock generation circuit that generates a clock much faster than the channel clock, and accordingly consumed power becomes large.

The inventive apparatus described in the patent document 4 is so structured that it delays a binary signal successively by reference periods of 1 T/S using an S-stage delay device, applies sampling to the delayed signals using a channel clock, and carries out the jitter count at high resolution. Therefore, large differences occur without an additional PLL circuit, and the apparatus cannot interact with various reproduction speeds. Besides, an additional PLL is required to carry out the jitter count to high accuracy.

As mentioned above, the above conventional jitter counters need a high-speed clock generation circuit, an A/D converter, a PLL circuit dedicated to the jitter count, a VCO and the like. Accordingly, the conventional jitter counters cannot be built in a digital system LSI at low cost.

SUMMARY OF THE INVENTION

The present invention has been made to cope with the conventional problems, and it is an object of the present invention to provide a jitter counter that has a simple structure and allows a high-accurate jitter count, and an optical disc apparatus using the jitter count.

To achieve the object, a jitter counter according to the present invention is connected to a PLL circuit for generating a clock signal, which is necessary for signal processing, from a binary signal, and counts jitters of the binary signal. The jitter counter comprises: a determination signal generation circuit which generates a determination signal that has a given pulse width having its phase center at the position of a pulse edge of the clock signal by using an output signal from a VCO constituting the PLL circuit and the like; a phase determination circuit which at every time when a logic inversion of the binary signal occurs, determines whether or not the inversion position is present in a determination section given by the pulse width of the determination signal based on an output signal from a phase comparator constituting the PLL circuit and on the determination signal; a phase counter which counts the number of times that inversion positions of the binary signal are not present in the determination section (or times that inversions position of the binary signal are present in the determination section) based on an output signal from the phase determination circuit, wherein a count value of the phase counter is output as a jitter count value.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Hereinafter, the present invention is described in detail using an example in which a jitter counter according to the present invention is incorporated in an optical disc apparatus.

Figure 1:
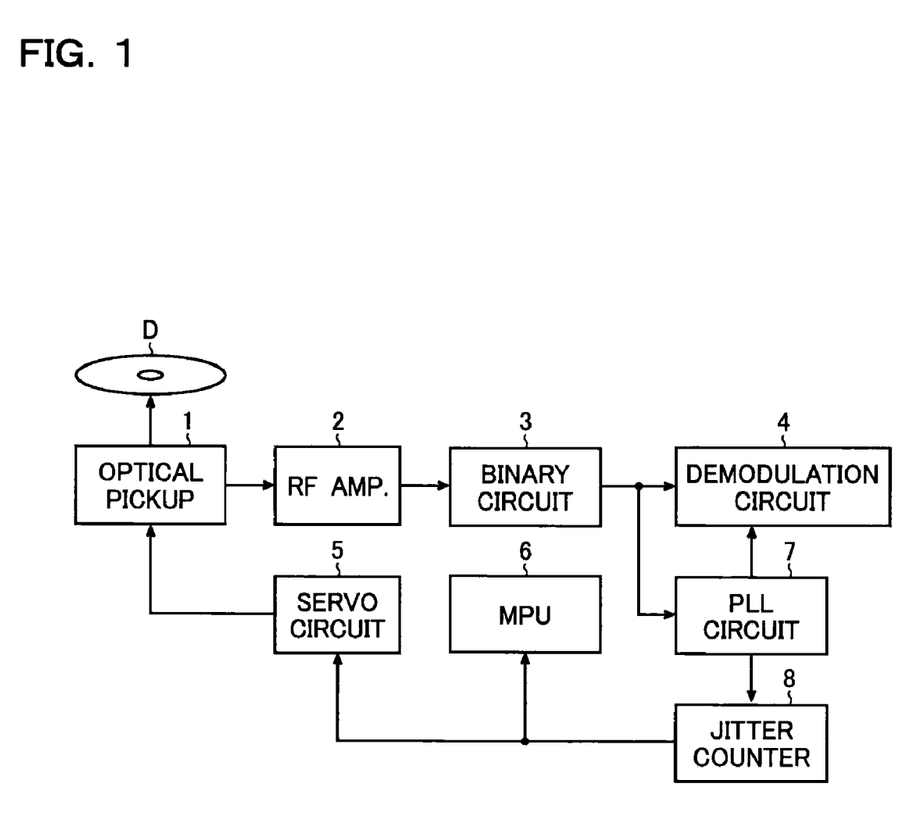
FIG. 1 is a block diagram showing an embodiment of an optical disc apparatus according to the present invention.

FIG. 1 is a block diagram showing an embodiment of an optical disc apparatus according to the present invention.

As shown in FIG. 1, an optical disc apparatus according to the present invention comprises an optical pickup 1, an RF amplifier (amp.) 2, a binary circuit 3, a demodulation circuit 4, a servo circuit 5, a microprocessor 6 (hereinafter, called an MPU [Micro Processing Unit] 6), a PLL circuit 7, and a jitter counter 8.

In reproducing data from an optical disc D, the optical pickup 1 is means that directs a light beam to the optical disc D and generates a reproduction RF signal depending on intensity of the reflected light.

The RF amp. 2 is means that applies waveform equalization processing to the reproduction RF signals to equalize the amplitude levels.

The binary circuit 3 is means that applies binary processing to a reproduction RF signal which has undergone the waveform equalization processing to generate a binary RF signal (e.g, an EFM [Eight-Fourteen Modulation] signal and an EFMplus signal).

The demodulation circuit 4 is means that demodulates (inclusive of sampling processing and error correction processing and the like) a binary RF signal to generate reproduction data from the optical disc D.

The servo circuit 5 is means that carries out tracking servo and focus servo and the like on the optical pickup 1 for the optical disc D.

The MPU 6 is means that carries out a comprehensive control over operation of the optical disc apparatus.

The PLL circuit 7 is means that from a binary RF signal, generates a channel clock signal which is used for demodulation of the binary RF signal, and outputs it to the demodulation circuit 4.

The jitter counter 8 is means that counts jitters of a binary RF signal and outputs a jitter count value, that is, a result of the count, to the servo circuit 5 and the MPU 6.

Next, before describing the jitter counter 8 in detail, a jitter of a binary RF signal to be counted is described.

Figure 2:
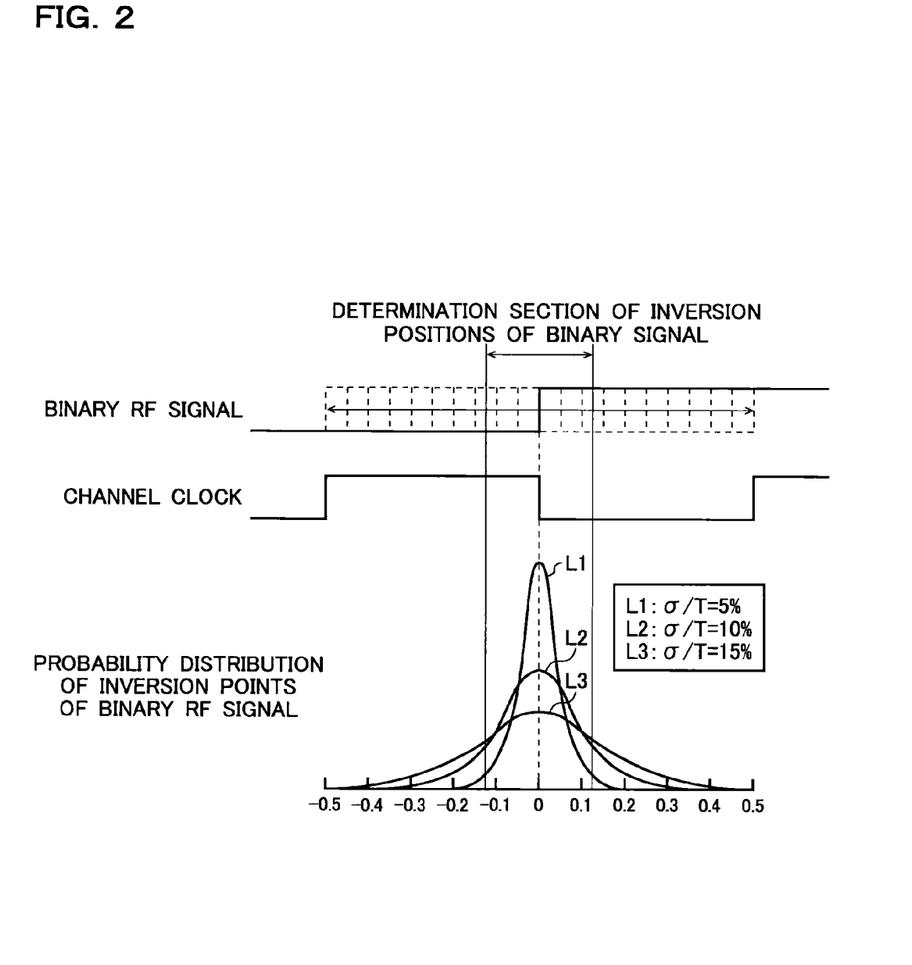
FIG. 2 is a view to explain a relationship between a jitter and a jitter distribution.

FIG. 2 is a correlative view showing a relationship between a jitter and a jitter distribution, and from the upper portion, a binary RF signal, a channel clock signal, and a probability distribution of inversion points of the binary RF signal are represented.

As shown in FIG. 2, because of various noise factors, the binary RF signal has jitters that have the phase center at the position of a falling edge of the channel clock signal which is synchronized with the binary RF signal in phase (see broken lines and arrows that are represented together with the binary RF signal).

Generally, when a jitter is represented using a probability distribution of inversion points of binary the RF signal, it has a normal distribution. For example, according to the DVD [Digital Versatile Disc] standards, a value that is obtained by dividing σ (standard deviation) of this distribution by T (the period of the channel clock signal) is defined as a jitter σ/T.

So, taking the above characteristic into consideration, the jitter counter 8, which is incorporated in the optical disc apparatus according to the present embodiment, is so structured that at every time when a logic inversion of the binary RF signal occurs, the jitter counter 8 carries out the jitter count by determining whether or not the inversion position is present in a given section that has the phase center at the position of a falling edge of the channel clock signal.

More specifically, the jitter counter 8 is so structured that it generates a determination signal having a given pulse width (a pulse width equal to 10% (±5%) to 30% (±15%) of the pulse width of the channel clock signal) which has the phase center at the position of a falling edge of the channel clock signal, counts the number of times that inversion positions of the binary RF signal are not present in a determination section defined by the pulse width of the determination signal, and thus carries out the jitter count. Of course, instead of this embodiment, the jitter counter 8 may be so structured that it carries out the jitter count by counting the number of times that inversion positions of the binary RF signal are present in a given determination section.

Comparing solid lines L1-L3 shown in the lower portion of FIG. 2 with each other, it can be seen that the larger the jitter is, the higher the possibility that an inversion position of the binary RF signal does not fall in a given determination section becomes.

Next, internal structures and operations of the PLL circuit 7 and the jitter counter 8 are described in detail.

Figure 3:
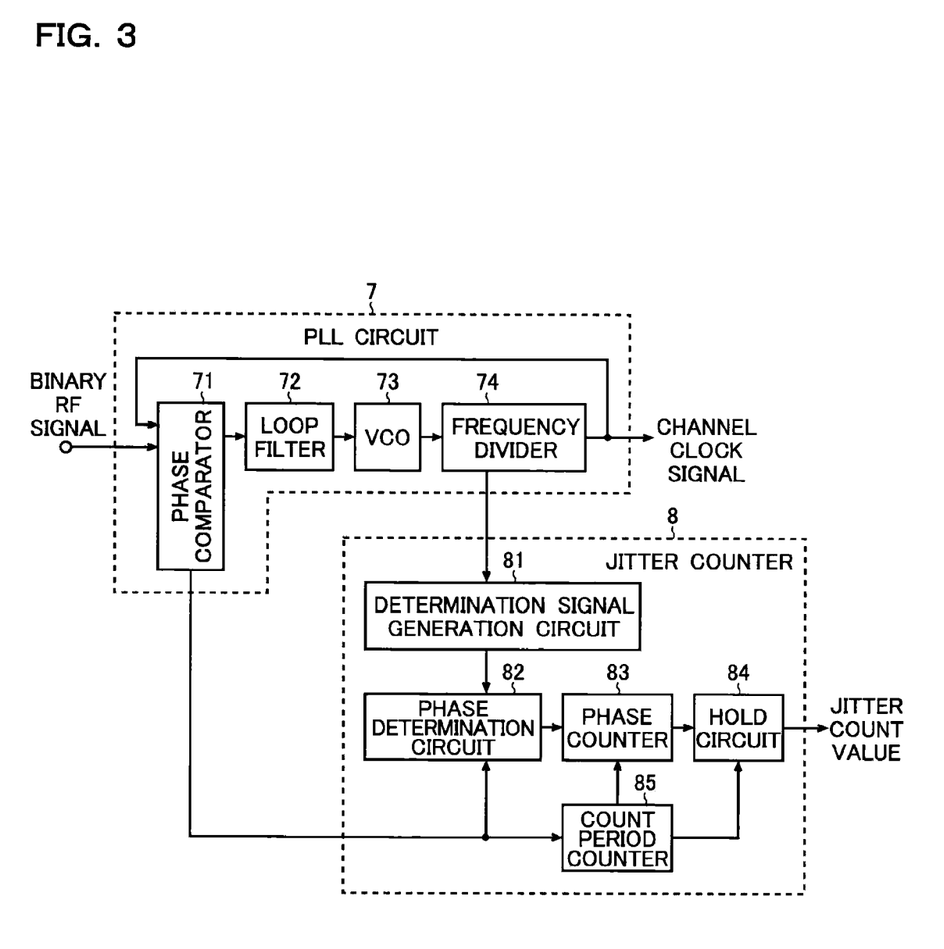
FIG. 3 is a block diagram showing structural examples of a PLL circuit 5 and a jitter counter 8.

FIG. 3 is a block diagram that shows structural examples of the PLL circuit 7 and the jitter counter 8.

As shown in FIG. 3, the PLL circuit 7 comprises a phase comparator 71, a loop filter 72, a voltage controlled oscillator 73 (hereinafter, called a VCO 73), and a frequency divider 74.

The phase comparator 71 is means that compares the phases of the binary RF signal and the channel clock signal with each other, and generates a phase error signal. A phase error signal falls at a logic inversion edge of the binary RF signal and rises at the second rising edge of the channel clock signal from the falling position.

The loop filter 72 is means that blocks an alternating-current component of a phase error signal, and generates a control voltage for the VCO 73.

The VCO 73 is means that generates a VCO clock signal which has a frequency depending on the control voltage.

The frequency divider 74 is means that generates the channel clock signal synchronized with the binary RF signal in phase by dividing the frequency of a VCO clock signal by an arbitrary frequency division ratio (e.g., ¼ frequency division).

The jitter counter 8 comprises a determination signal generation circuit 81, a phase determination circuit 82, a phase counter 83, a hold circuit 84, and a count period counter 85.

The determination signal generation circuit 81 is means that generates a determination signal having a given pulse width which has the phase center at the position of a pulse edge of the channel clock signal by using a VCO clock signal that is received directly from the VCO 73, or by using a frequency divided signal obtained by dividing the frequency of the VCO clock signal output via the frequency divider 74.

Figure 5:
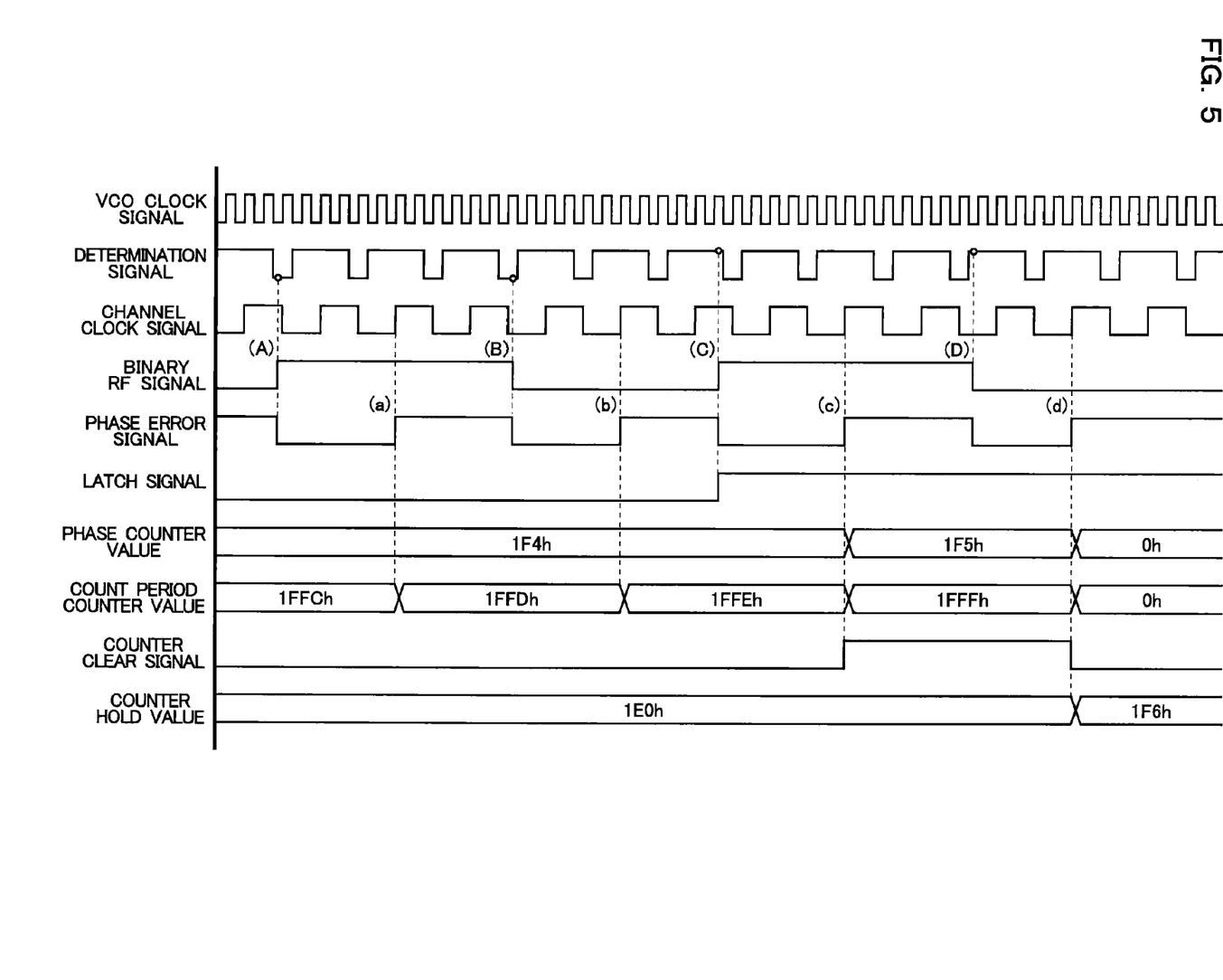
FIG. 5 is a timing chart to explain a jitter count operation.

For example, if the VCO clock signal has an oscillation frequency 4 times as high as that of the channel clock, the VCO clock signal can be directly used to generate a determination signal without dividing (frequency-dividing) the frequency of the VCO clock signal. Accordingly, as shown in FIG. 5 described later, a determination signal having a given pulse width (a pulse width equal to 25% (±12.5%) of the pulse width of the channel clock signal) which has the phase center at the position of a pulse edge of the channel clock signal can be easily generated.

For example, if the VCO clock signal has an oscillation frequency 8 times as high as that of the channel clock, the VCO clock signal is ½ frequency-divided to generate a frequency divided signal which has an oscillation frequency 4 times as high as that of the channel clock signal, and this frequency divided signal is used for the generation processing of a determination signal. In this way, the same determination signal as that described above can be easily generated.

On the other hand, in a case where the VCO clock signal has an oscillation frequency no more than 2 times as high as that of the channel clock, the VCO clock signal and its frequency divided signal cannot be used to generate the above desired determination signal unless they are shifted in phase (phase -shifted).

Figure 4:
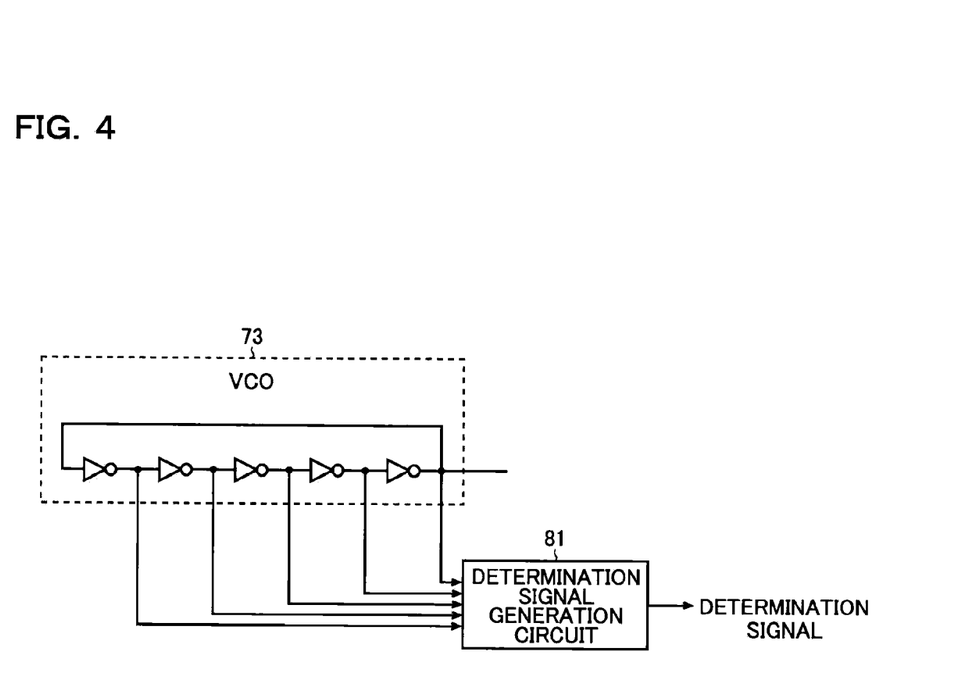
FIG. 4 is a block diagram to explain a modification of a way of generating a determination signal.

However, as shown in FIG. 4, in a case where a ring oscillator is used as the VCO 73, the output signals (more specifically, the output signals from the respective inverters connected in a ring) from the respective stages of the ring oscillator are phase-shifted by a given amount with respect to the channel clock signal. Accordingly, it is possible to generate the above desired determination signal by using these output signals without using an additional phase shift circuit.

The phase determination circuit 82 is means that based on an output signal (phase error signal) from the phase comparator 71 and on a determination signal generated by the determination signal generation circuit 81, at every time when a logic inversion of the binary RF signal occurs, determines whether or not the inversion position is present in a determination section defined by the pulse width of the determination signal. More specifically, the phase determination circuit 82 determines whether the determination signal has a high level or a low level by using the inversion position (a falling edge of the phase error signal) of the binary RF signal as a trigger, and outputs the resultant signal as a latch signal.

The phase counter 83 is means that counts the number of times that inversion positions of the binary RF signal are not present in the determination section based on the latch signal generated by the phase determination circuit 82. More specifically, the phase counter 83 monitors whether or not the latch signal has the high level by using a rising edge of the phase error signal input via the count period counter 85 as a trigger, and increases the count value if the latch signal has the high level. The count value of the phase counter 83 is reset at given count periods.

The hold circuit 84 is means that at given count periods, holds the count value of the phase counter 83 and outputs it as a jitter count value.

The count period counter 85 is means that counts the number of logic inversions of the binary RF signal (the number of rising edges of the phase error signal) and outputs a counter clear signal at every time when the count value reaches a predetermined value, thereby at given count periods, resets the count value of the phase counter 83 and updates the hold value of the hold circuit 84.

FIG. 5 is a timing chart to explain the jitter count operation, and from the upper portion, the following signals and values are represented: the VCO clock signal, the determination signal, the channel clock signal, the binary RF signal, the phase error signal, the latch signal, the phase counter value, the count period counter value, the counter clear signal, and the counter hold value.

FIG. 5 shows an example in which a determination signal, which has the phase center at the position of a falling edge of the channel clock signal and has a pulse width equal to 25% (±12.5%) of the pulse width of the channel clock signal, is generated by using the VCO clock signal that has a frequency 4 times as high as that of the channel clock signal.

At the timing (A), the binary RF signal becomes inverse in logic at an advanced position in phase with respect to the falling edge of the channel clock signal. However, the phase advancement is smaller than 12.5%, and the inversion position of the binary RF signal is present in the determination section defined by the pulse width of the determination signal. Accordingly, the output logic of the latch signal obtained by using the inversion position of the binary RF signal (the falling edge of the phase error signal) as a trigger goes low.

Then, at the timing (a), the phase counter 83 monitors whether or not the latch signal has the high level by using the rising edge of the phase error signal as a trigger. At the timing (a), because the latch signal has the low level, the phase counter 83 does not increase its count value and keeps the previous count value (1F4h). On the other hand, the count period counter 85 counts the number of logic inversions of the binary RF signal (the number of rising edges of the phase error signal), and increases the count value (from 1FFCh to 1FFDh).

At the timing (B), the binary RF signal becomes inverse in logic at a delayed position in phase with respect to the falling edge of the channel clock signal. However, the phase delay is smaller than 12.5%, and the inversion position of the binary RF signal is present in the determination section defined by the pulse width of the determination signal. Accordingly, the output logic of the latch signal obtained by using the inversion position of the binary RF signal (the falling edge of the phase error signal) as a trigger goes low.

Then, at the timing (b), the phase counter 83 monitors whether or not the latch signal has the high level by using the rising edge of the phase error signal as a trigger. At the timing (b), because the latch signal has the low level, the phase counter 83 does not increase its count value and keeps the previous count value (1F4h in the example shown in FIG. 5). On the other hand, the count period counter 85 counts the number of logic inversions of the binary RF signal (the number of rising edges of the phase error signal), and increases its count value (from 1FFDh to 1FFEh).

At the timing (C), the binary RF signal becomes inverse in logic at an advanced position in phase with respect to the falling edge of the channel clock signal. The phase advancement is larger than 12.5%, and the inversion position of the binary RF signal is out of the determination section defined by the pulse width of the determination signal. Accordingly, the output logic of the latch signal obtained by using the inversion position of the binary RF signal (the falling edge of the phase error signal) as a trigger goes high.

Then, at the timing (c), the phase counter 83 monitors whether or not the latch signal has the high level by using the rising edge of the phase error signal as a trigger. At the timing (c), because the latch signal has the high level, the phase counter 83 increases its count value (from 1F4h to 1F5h). The count period counter 85 counts the number of logic inversions of the binary RF signal (the number of rising edges of the phase error signal), and increases its count value (from 1FFEh to 1FFFh). Here, because the count value of the count period counter 85 has become equal to a preset target period −1 (=1FFFh), the count period counter 85 sets the counter clear signal to the high level.

At the timing (D), the binary RF signal becomes inverse in logic at a delayed position in phase with respect to the falling edge of the channel clock signal. The phase delay is larger than 12.5%, and the inversion position of the binary RF signal is out of the determination section defined by the pulse width of the determination signal. Accordingly, the output logic of the latch signal obtained by using the inversion position of the binary RF signal (the falling edge of the phase error signal) as a trigger goes high.

Then, at the timing (d), because the count clear signal has the high level, both the count values of the phase counter 83 and the count period counter 85 are cleared to the zero value (oh). Besides, at the same time, the hold value (jitter count value) of the hold circuit 84 is updated from the previous hold value (1Eoh) to a new hold value (1F6h).

In the example shown in FIG. 5, because the latch signal has the high level at the timing (d), the count value (1F6h) that is obtained by increasing by only one the count value (1F5h) immediately before resetting the phase counter 83 is held by the hold circuit 84. However, if the latch signal has the low level at the timing (d), the count value (1F5h) immediately before the reset is held unchanged.

Figure 6:
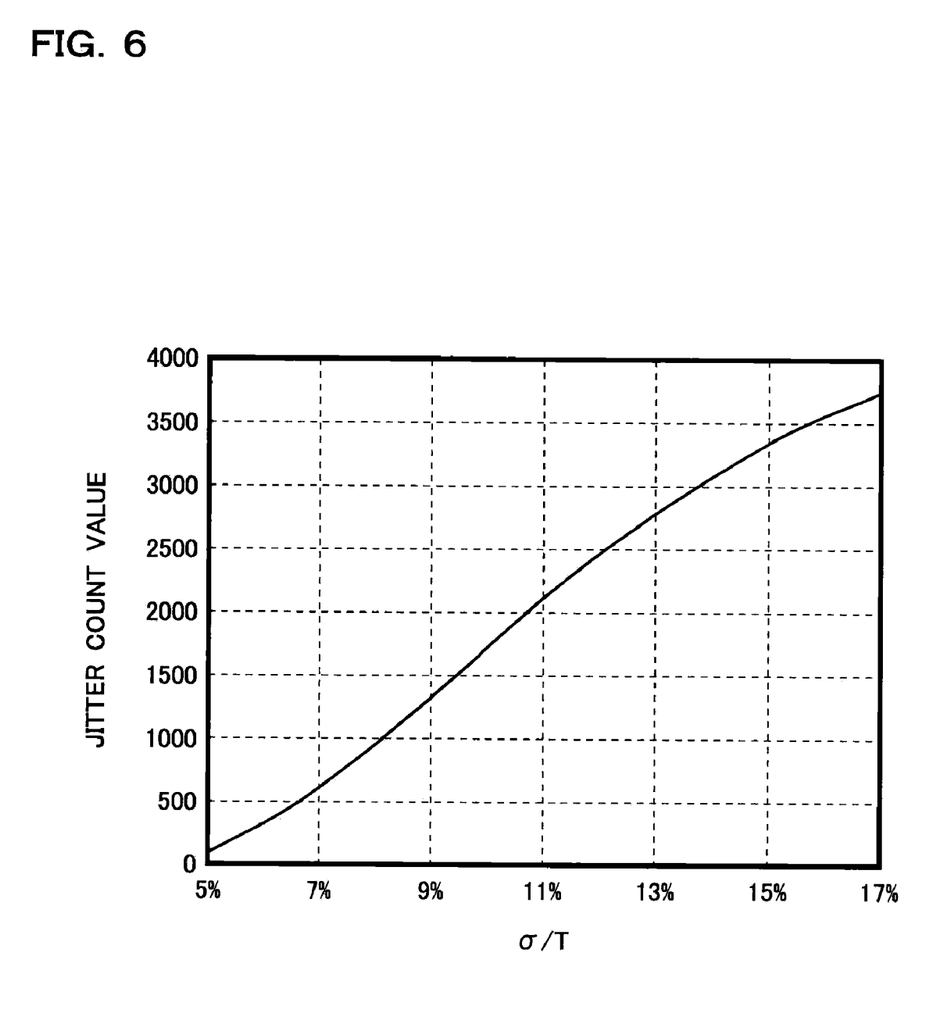
FIG. 6 is a correlative view showing a relationship between a jitter of a binary RF signal and a jitter count value.

FIG. 6 is a correlative view showing a relationship between the jitter of the binary RF signal and the jitter count value.

FIG. 6 shows a result in a case where the pulse width of the determination signal is equal to 25% (±12.5%) of the pulse width of the channel clock signal, and the jitter count period (jitter count number) is 8192.

As shown in FIG. 6, it can be seen that the jitter count value obtained by the jitter counter 8 changes in such a manner that the jitter count value is proportionate to the jitter of the binary RF signal.

As described above, the jitter counter 8 incorporated in the optical disc apparatus according to the present embodiment can carry out the count of jitters of the binary RF signal using the group of circuits (the circuit blocks 1-7 shown in FIG. 1) that are necessary for a usual reproduction operation of the optical disc D and an additional simple digital circuit having only a few hundreds of gates, that is, the jitter count 8 does not need any analog circuits dedicated to the jitter count (a high-speed clock generation circuit, a high-accurate A/D converter, a PLL circuit, a VCO and the like). Accordingly, even if the jitter counter 8 is introduced in a digital LSI, it is possible to carry out the jitter count at low cost and to high accuracy.

In the above embodiment, the example in which the jitter counter according to the present invention is incorporated in the optical disc apparatus has been explained. However, the application of the present invention is not limited to this embodiment, that is, the present invention can be applied to jitter counters that are used for other purposes.

Besides the above embodiment, it is possible to add various modifications to the present invention without departing from the spirits of the present invention.

For example, in the above embodiment, the example in which the pulse width of the determination signal is set to 25% (±12.5%) of the pulse width of the channel clock signal. However, the present invention is not limited to this embodiment, that is, the pulse width of the determination signal can be set to any pulse width as long as a correct jitter count value can be obtained from the binary RF signal.

Figure 7:
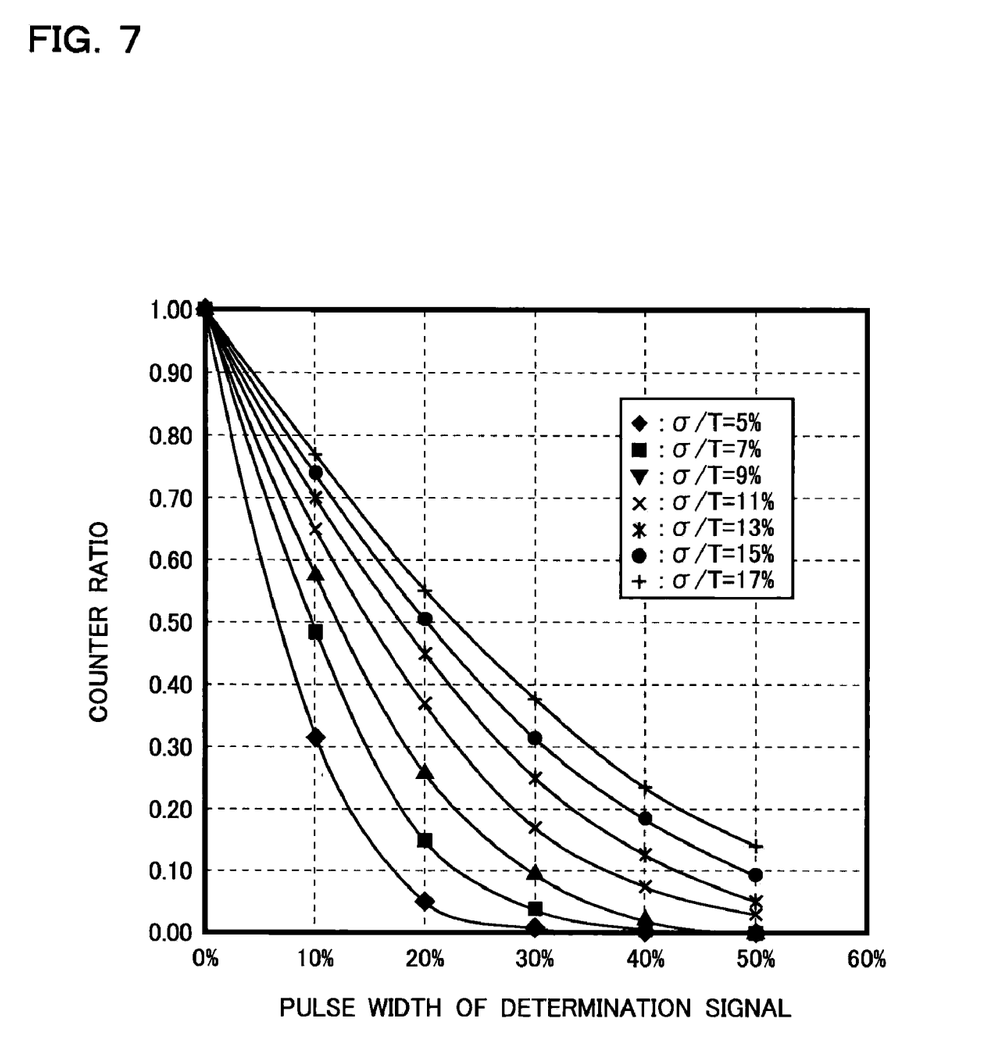
FIG. 7 is a correlative view showing a relationship between a width of a determination signal and a counter ratio.

FIG. 7 is a correlative view showing a relationship between the pulse width of the determination signal (the ratio of the pulse width of the determination signal to the pulse width of the channel clock signal) and the counter ratio (the ratio of the count value (equal to the jitter count value) of the phase counter 83 immediately after the lapse of the count period to the count value of the count period counter 85). In FIG. 7, a graph in a case where the jitter changes in a range of 5% to 17% is represented.

As shown in FIG. 7, it can be seen that a sufficiently appropriate jitter count value can be obtained from the jitter that changes in the range of 5% to 17% by using the determination signal which has the pulse width equal to 10% (±5%) to 30% (±15%) of the pulse width of the channel clock signal. Accordingly, it is desirable that the pulse width of the determination signal is set to a value in the range of 10% (±5%) to 30% (±15%) of the pulse width of the channel clock signal.

In the above embodiment, the example in which the determination signal that has the phase center at the position of a pulse edge of the channel clock signal and has the low level during the given pulse width is generated. However, the present invention is not limited to this embodiment, that is, the logic of the determination signal may be inverse to that in the above embodiment.

Effects of the present invention are described. The jitter counter according to the present invention can carry out the jitter count using a low-cost structure and to high accuracy. Besides, the optical disc apparatus according to the present invention can optimally adjust an offset amount of focus servo and offset servo, waveform equalization characteristics of an RF amp., and various characteristics of an optical pickup based on the jitter count value of the binary RF signal.

The industrial applicability of the present invention is described. The present invention is a suitable technology for general electronic apparatuses (an optical disc drive for a personal computer, an optical disc player, an optical disc recorder, a game machine using an optical disc, a digital video camera data of which can be recorded on an optical disc, and the like) which incorporate an optical disc reproduction function.

While the present invention has been described with respect to the preferred embodiment, it will be apparent to those skilled in the art that the disclosed invention may be modified in numerous ways and may assume many embodiments other than those specifically set out and described above. Accordingly, it is intended by the appended claims to cover all modifications of the present invention which fall within the true spirit and scope of the invention.

What is claimed is:

1. A jitter counter which is connected to a PLL circuit for generating a clock signal, which is necessary for signal processing, from a binary signal, and counts jitters of the binary signal, the jitter counter comprising:
   a determination signal generation circuit which generates a determination signal that has a given pulse width having the phase center at the position of a pulse edge of the clock signal by using an output signal from a voltage controlled oscillator constituting the PLL circuit, or using a frequency divided signal obtained by dividing the frequency of the output signal from the voltage controlled oscillator, or using output signals from the respective stages of a ring oscillator constituting the voltage controlled oscillator;
   a phase determination circuit which at every time when logic inversion of the binary signal occurs, determines whether or not the inversion position is present in a determination section given by the pulse width of the determination signal based on an output signal from a phase comparator constituting the PLL circuit and on the determination signal;
   a phase counter which based on an output signal from the phase determination circuit, counts the number of times that inversion positions of the binary signal are not present in the determination section or times that inversion positions of the binary signal are present in the determination section,
   wherein the jitter counter outputs a count value of the phase counter as a jitter count value.

2. The jitter counter according to claim 1, further comprising:
   a hold circuit which holds a count value of the phase counter and outputs it as a jitter count value;
   a count period counter which counts the number of logic inversions of the binary signal, and at every time when the count value reaches a predetermined value, resets the count value of the phase counter, and updates the hold value of the hold circuit.

3. The jitter counter according to claim 1, wherein
   the given pulse width is a pulse width equal to 10% (±5%) to 30% (±15%) of a pulse width of the clock signal.

4. An optical disc apparatus, comprising:
   an optical pickup which directs a light beam to an optical disc and generates a reproduction signal depending on intensity of the reflected light;
   a binary circuit which generates a binary signal by applying binary processing to the reproduction signal;

a demodulation circuit which demodulates the binary signal;

a PLL circuit which from the binary signal, generates a clock signal which is necessary for demodulation of the binary signal, and outputs it to the demodulation circuit; and a jitter counter which is connected to the PLL circuit, and counts jitters of the binary signal, the jitter counter includes:

a determination signal generation circuit which generates a determination signal that has a given pulse width having the phase center at the position of a pulse edge of the clock signal by using an output signal from a voltage controlled oscillator constituting the PLL circuit, or using a frequency divided signal obtained by dividing the frequency of the output signal from the voltage controlled oscillator, or using output signals from the respective stages of a ring oscillator constituting the voltage controlled oscillator;

a phase determination circuit which at every time when logic inversion of the binary signal occurs, determines whether or not the inversion position is present in a determination section given by the pulse width of the determination signal based on an output signal from a phase comparator constituting the PLL circuit and on the determination signal;

a phase counter which based on an output signal from the phase determination circuit, counts the number of times that inversion positions of the binary signal are not present in the determination section or times that inversion positions of the binary signal are present in the determination section, wherein the jitter counter outputs a count value of the phase counter as a jitter count value.

5. The optical disc apparatus according to claim 4, wherein the jitter counter further including:

a hold circuit which holds a count value of the phase counter and outputs it as a jitter count value;

a count period counter which counts the number of logic inversions of the binary signal, and at every time when the count value reaches a predetermined value, resets the count value of the phase counter, and updates the hold value of the hold circuit.

6. The optical disc apparatus according to claim 4, wherein the given pulse width is a pulse width equal to 10% (±5%) to 30% (±15%) of a pulse width of the clock signal.

7. The optical disc apparatus according to claim 4, further comprising:

a servo circuit which carries out tracking servo and focus servo on the optical pickup for the optical disc depending on the jitter count value.

* * * * *